United States Patent
Bui et al.

(10) Patent No.: US 8,164,151 B2
(45) Date of Patent: Apr. 24, 2012

(54) THIN ACTIVE LAYER FISHBONE PHOTODIODE AND METHOD OF MANUFACTURING THE SAME

(75) Inventors: Peter Steven Bui, Cerritos, CA (US); Narayan Dass Taneja, Long Beach, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 431 days.

(21) Appl. No.: 11/744,908

(22) Filed: May 7, 2007

(65) Prior Publication Data

US 2008/0277753 A1    Nov. 13, 2008

(51) Int. Cl.
*H01L 31/0352* (2006.01)
(52) U.S. Cl. ......... 257/437; 257/E27.129; 257/E27.131; 257/E27.14; 257/E31.038
(58) Field of Classification Search ................. 257/233, 257/290–292, 414, 431–496
See application file for complete search history.

(56) References Cited

U.S. PATENT DOCUMENTS

| | | | |
|---|---|---|---|
| 3,887,936 A * | 6/1975 | Shannon et al. ............... 257/80 |
| 4,874,939 A | 10/1989 | Nishimoto et al. | |
| 4,887,140 A | 12/1989 | Wang | |
| 4,904,608 A | 2/1990 | Gentner et al. | |
| 4,904,861 A | 2/1990 | Epstein et al. | |
| 4,998,013 A | 3/1991 | Epstein et al. | |
| 5,049,962 A * | 9/1991 | Huang et al. ............... 257/463 |
| 5,144,379 A | 9/1992 | Eshita et al. | |
| 5,214,276 A | 5/1993 | Himoto et al. | |
| 5,237,197 A | 8/1993 | Snoeys et al. | |
| 5,252,142 A | 10/1993 | Matsuyama et al. | |
| 5,276,955 A | 1/1994 | Noddin et al. | |
| 5,408,122 A * | 4/1995 | Reele ............................. 257/448 |
| 5,430,321 A | 7/1995 | Effelsberg | |
| 5,446,308 A * | 8/1995 | Piccone et al. ................ 257/438 |
| 5,446,751 A | 8/1995 | Wake | |
| 5,501,990 A | 3/1996 | Holm et al. | |
| 5,576,559 A | 11/1996 | Davis | |
| 5,599,389 A | 2/1997 | Iwasaki | |
| 5,656,508 A | 8/1997 | So et al. | |
| 5,818,096 A | 10/1998 | Ishibashi et al. | |
| 5,825,047 A | 10/1998 | Ajisawa et al. | |
| 5,869,834 A | 2/1999 | Wipenmyr | |
| 5,923,720 A | 7/1999 | Barton et al. | |
| 5,928,438 A | 7/1999 | Salami et al. | |
| 6,218,684 B1 | 4/2001 | Kuhara et al. | |
| 6,326,649 B1 | 12/2001 | Chang et al. | |

(Continued)

FOREIGN PATENT DOCUMENTS

EP      0 347 157      12/1989

(Continued)

OTHER PUBLICATIONS

Int'l Search Report PCT/US09/056875, Publication Date Sep. 15, 2009, UDT Sensors, Inc.

*Primary Examiner* — David Vu
*Assistant Examiner* — Jonathan Han
(74) *Attorney, Agent, or Firm* — Novel IP

(57) ABSTRACT

The present invention is directed toward a detector structure, detector arrays, and a method of detecting incident radiation. The present invention comprises a photodiode array and method of manufacturing a photodiode array that provides for reduced radiation damage susceptibility, decreased affects of crosstalk, reduced dark current (current leakage) and increased flexibility in application.

16 Claims, 9 Drawing Sheets

Step 490

U.S. PATENT DOCUMENTS

| | | | |
|---|---|---|---|
| 6,352,517 | B1 | 3/2002 | Flock et al. |
| 6,426,991 | B1 | 7/2002 | Mattson et al. |
| 6,438,296 | B1 | 8/2002 | Kongable |
| 6,489,635 | B1 | 12/2002 | Sugg |
| 6,504,158 | B2 | 1/2003 | Possin |
| 6,510,195 | B1 | 1/2003 | Chappo et al. |
| 6,546,171 | B2 | 4/2003 | Fukutomi |
| 6,569,700 | B2 | 5/2003 | Yang |
| 6,593,636 | B1 * | 7/2003 | Bui et al. ............... 257/463 |
| 6,670,258 | B2 | 12/2003 | Carlson et al. |
| 6,734,416 | B2 | 5/2004 | Carlson et al. |
| 6,815,790 | B2 | 11/2004 | Bui et al. |
| 6,826,080 | B2 | 11/2004 | Park et al. |
| 7,057,254 | B2 | 6/2006 | Bui et al. |
| 7,198,972 | B2 * | 4/2007 | Sato ............................ 438/47 |
| 2002/0056845 | A1 | 5/2002 | Iguchi et al. |
| 2004/0222358 | A1 * | 11/2004 | Bui et al. ............... 250/214.1 |
| 2004/0222482 | A1 * | 11/2004 | Bui et al. ............... 257/461 |
| 2005/0186754 | A1 * | 8/2005 | Kim ............................ 257/797 |
| 2006/0220078 | A1 | 10/2006 | Bui et al. |
| 2006/0255420 | A1 | 11/2006 | Bui et al. |
| 2008/0128846 | A1 | 6/2008 | Bui et al. |

FOREIGN PATENT DOCUMENTS

| | | |
|---|---|---|
| EP | 0 723 301 A2 | 5/1997 |
| EP | 0 723 301 B1 | 7/2000 |
| EP | 1 069 626 A2 | 1/2001 |
| EP | 1 205 983 A1 | 5/2002 |
| WO | WO/00/52766 | 9/2000 |

* cited by examiner

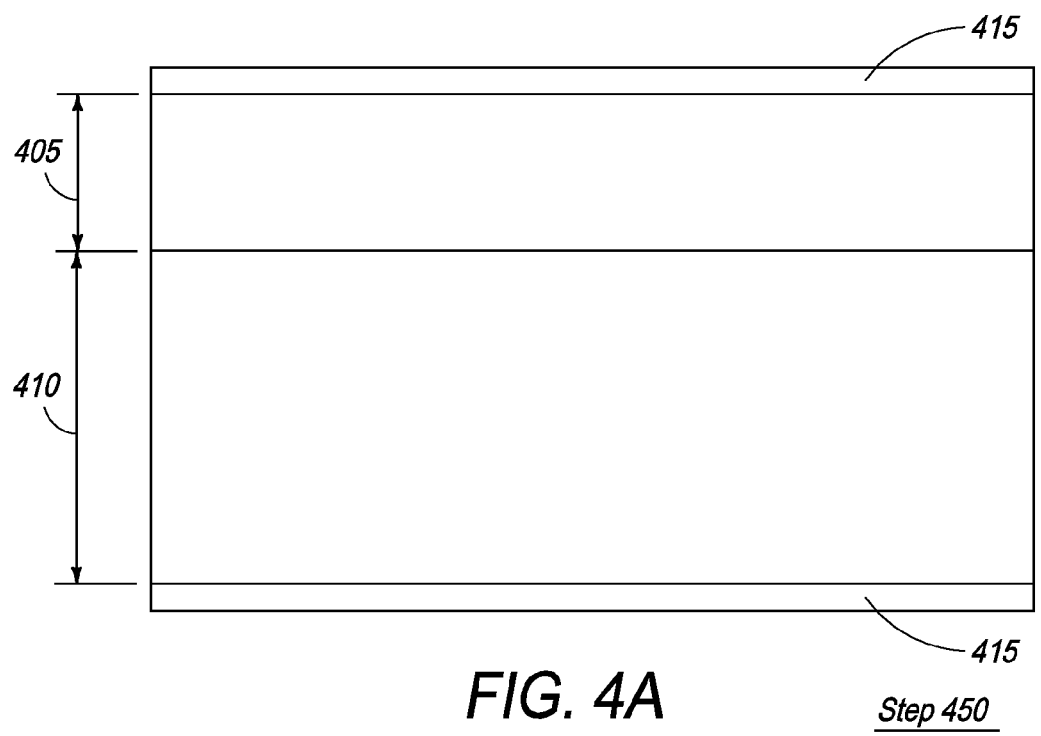
FIG. 4A  Step 450
FIG. 4B  Step 455

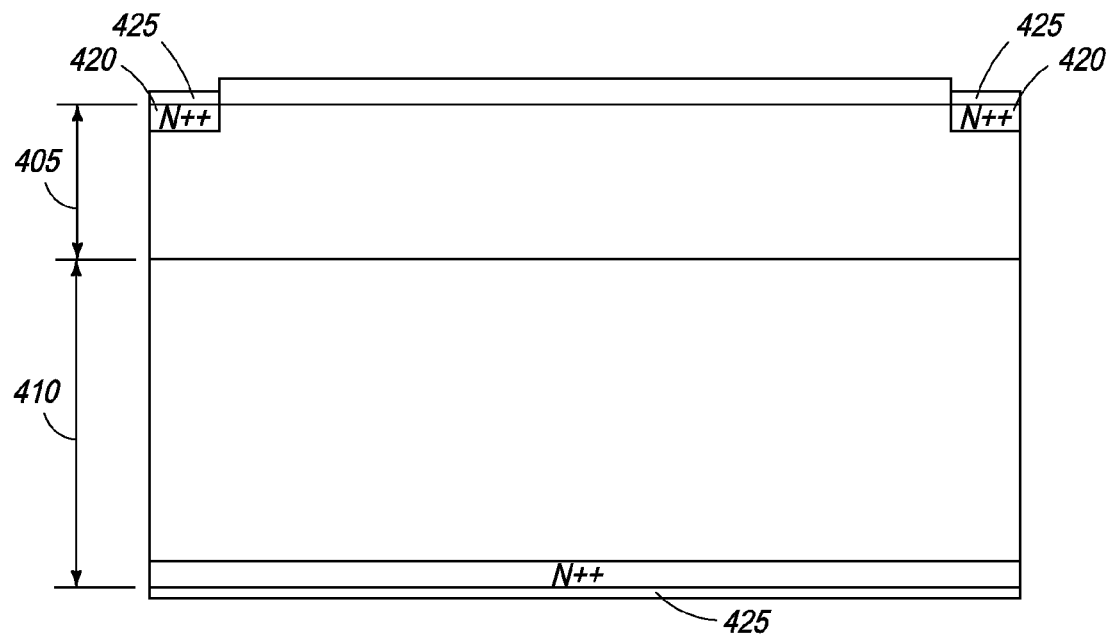
FIG. 4C    Step 460
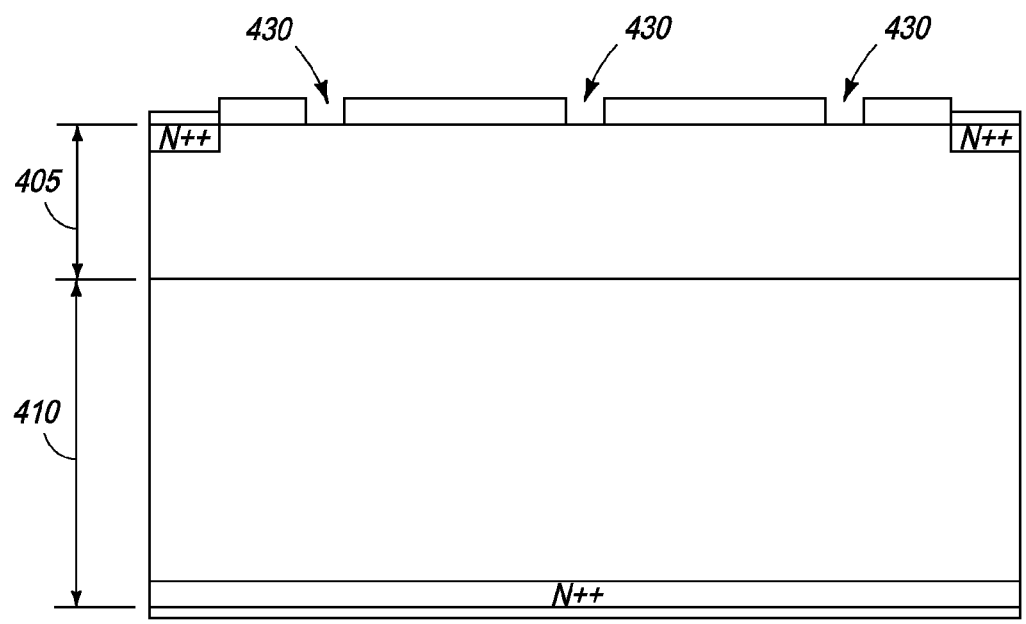
FIG. 4D    Step 465

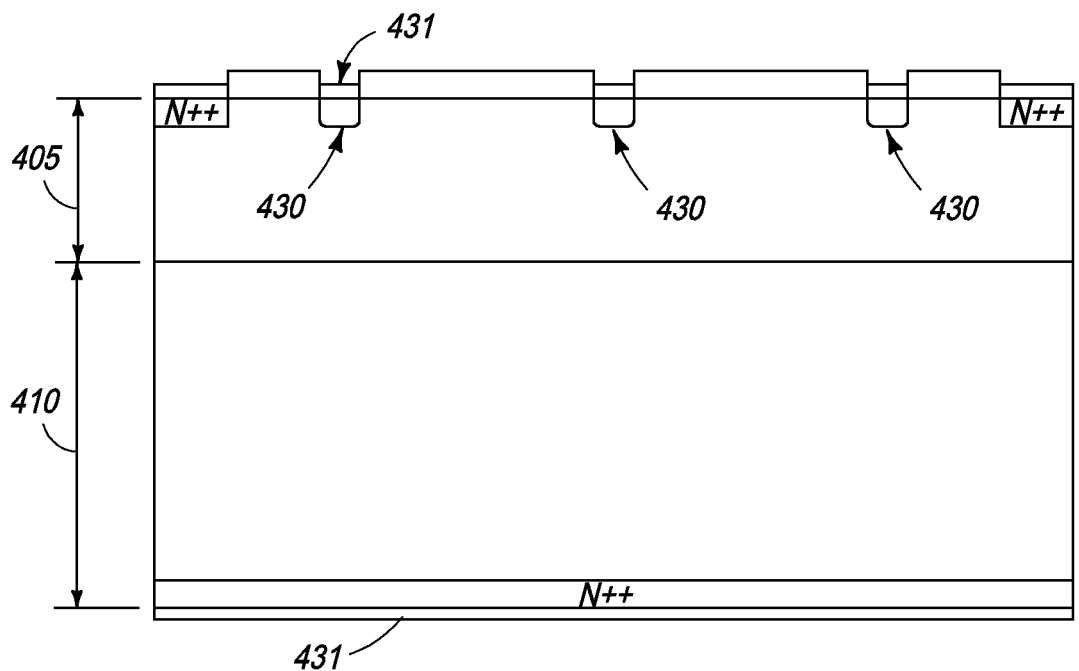
*FIG. 4E*  Step 470
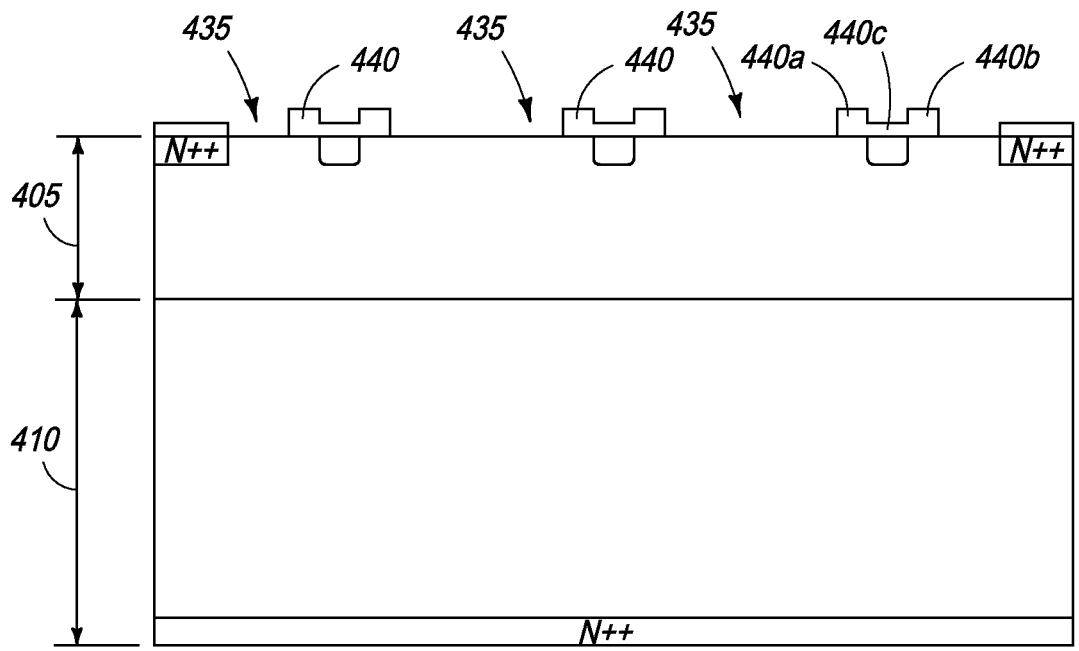
*FIG. 4F*  Step 475

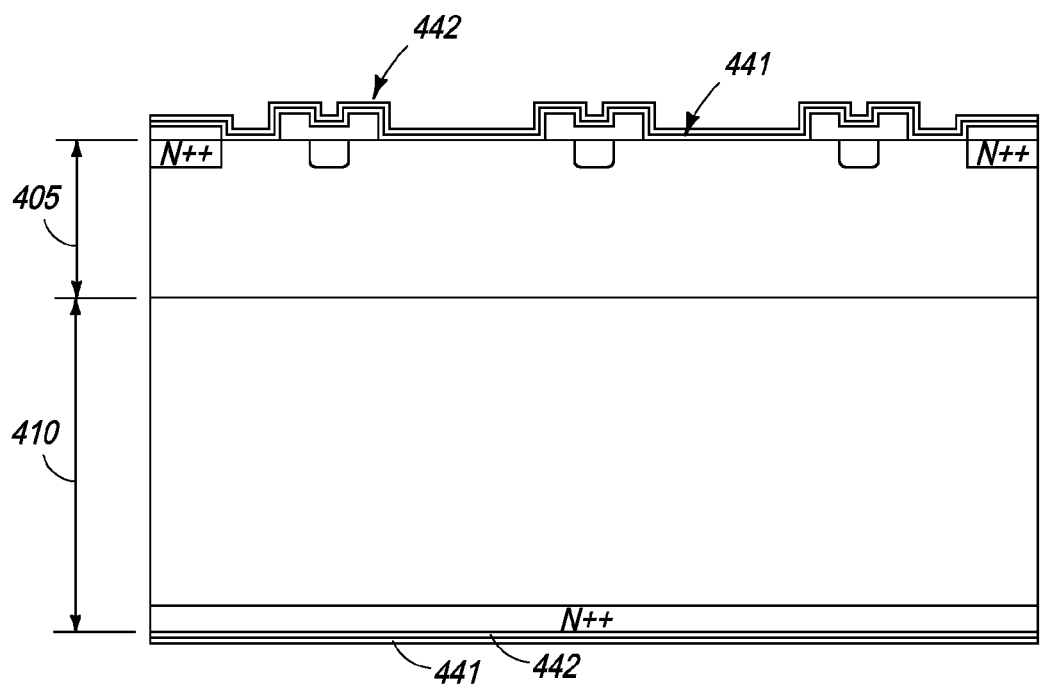
*FIG. 4G*  Step 480
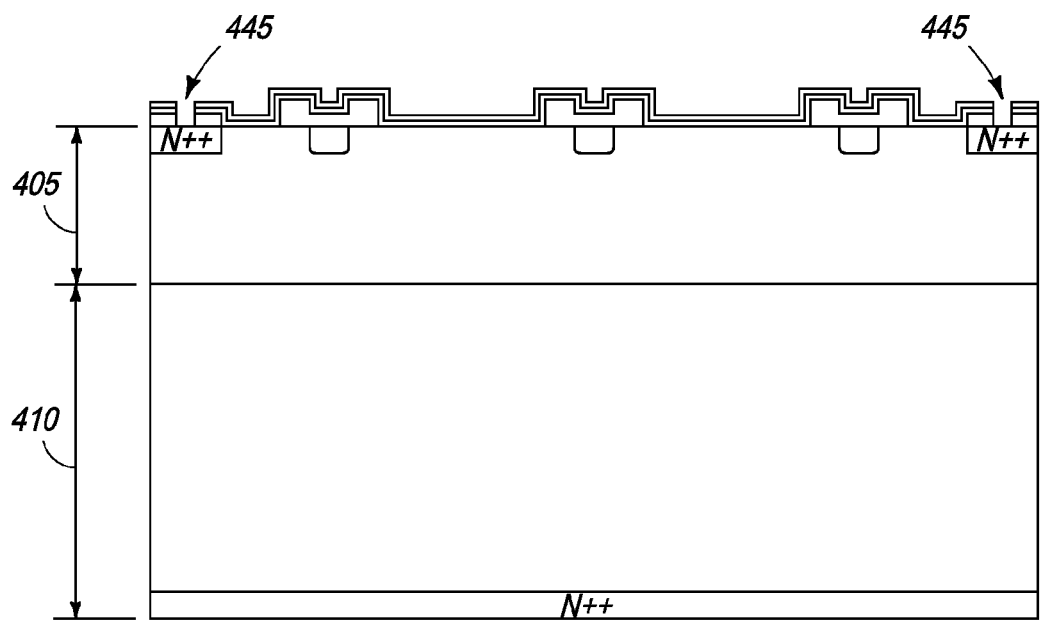
*FIG. 4H*  Step 485

THIN ACTIVE LAYER FISHBONE PHOTODIODE AND METHOD OF MANUFACTURING THE SAME

FIELD OF THE INVENTION

The present invention relates to a photodiode array having improved device characteristics. Specifically, the present invention relates to a photodiode device having a fishbone structure that can be fabricated on a thin active layer, such as epi or a thin direct-bonded layer. More specifically, the present invention relates to a photodiode array that has reduced junction capacitance, reduced dark current, and an improved signal-to-noise ratio.

BACKGROUND OF THE INVENTION

Conventional computed tomography (CT) scanners and digital radiography systems use large numbers of X-ray detectors, on the order of several hundred to several thousand, in which each X-ray detector includes a scintillator to convert X-rays into light and a photocell, or photodiode array, to convert light into an electrical signal.

Certain photodiodes have two-electrode radiation-sensitive junctions formed in semiconductor material. Light, which illuminates the junction, creates charge carriers (via mobile or "free" electrons and holes). Doping a semiconductor with a small amount of impurity greatly increases the number of charge carriers within the semiconductor. When a doped semiconductor has excess (majority) holes, it is called p-type and when it contains excess (majority) free electrons, it is known as n-type. The holes in a p-dopes semiconductor are majority carriers while the electrons are minority carriers. In the case of n-type doping, the electrons are the majority carriers and the holes are the minority carriers. The junctions which form where n-type and p-type semiconductors join together are called P-N junctions. At the P-N junction, there forms a region called the depletion zone, which blocks current conduction from the n-type region to the p-type region, but allows current to conduct from the p-type region to the n-type region. The depletion region is void of all majority carriers and is a non-conducting layer. In other words, the recombination of holes and electrons at the P-N junction causes the region to become depleted of mobile charge.

The depletion region forms across the P-N junction when the junction is in thermal equilibrium, i.e. things are in a steady state. Electrons and holes will diffuse into regions with lower concentrations of electrons and holes. N-type semiconductors have an excess of free electrons while P-type semiconductors have an excess of holes. Therefore, when a P-N junction is formed, electrons will diffuse into the P side and holes will diffuse into the N side. When a hole and an electron come into contact, however, they eliminate each other through recombination. This bares the donor atoms adjacent to the depletion region, which are now charged ions. The ions are positive on the N side and negative on the P side, creating an electric field that counteracts the continued diffusion of charge carriers. When the electric field is sufficient to repel incoming holes and electrons, the depletion region reaches its equilibrium width.

Under reverse bias (P negative with respect to N) this potential is increased, further widening the depletion zone. Forward bias (P positive with respect to N) narrows the zone and eventually reduces it to nothing, making the junction conductive and allowing free flow of charge carriers. Thus, it is possible to manipulate the non-conductive layer to allow a flow of electricity in one direction but not the other (opposite) direction. When the P-N junction is forward-biased, electric charge flows freely due to reduced resistance of the P-N junction. When the P-N junction is reverse biased, however, the junction barrier (and therefore resistance) becomes greater and charge flow is minimal.

Essentially active solid-state semiconductor devices, and in particular, silicon photodiodes, are among the most popular photodetectors having a sufficiently high performance over a large wavelength range with ease of use. Silicon photodiodes are sensitive to light in the wide spectral range, extending from deep ultraviolet through visible to near infrared, which is approximately 200 nm to 1100 nm. Silicon photodiodes, by using their ability to detect the presence or absence of minute light intensities, facilitate the extremely precise measurement of these minute light intensities upon appropriate calibration. For example, appropriately calibrated silicon photodiodes detect and measure light intensities varying over a wide range, from very minute light intensities of below $10^{-13}$ watts/$cm^2$ to high intensities above $10^{-3}$ watts/$cm^2$.

Silicon photodiodes can be employed in an assortment of applications including, but not limited to, spectroscopy, distance and speed measurement, laser ranging, laser guided missiles, laser alignment and control systems, optical free air communication, optical radar, radiation detection, optical position encoding, film processing, flame monitoring, scintillator read out, environmental applications such as spectral monitoring of earth ozone layer and pollution monitoring, low light-level imaging, such as night photography, nuclear medical imaging, photon medical imaging, and multi-slice computer tomography (CT) imaging, security screening and threat detection, thin photochip applications, and a wide range of computing applications.

Typically, photodiode arrays employ a scintillator material for absorbing high energy (ionizing) electromagnetic or charged particle radiation, which, in response, fluoresces photons at a characteristic wavelength. Scintillators are defined by their light output (number of emitted photons per unit absorbed energy) short fluorescence decay times, and optical transparency at wavelengths of their own specific emission energy. The lower the decay time of a scintillator, that is, the shorter the duration of its flashes of fluorescence are, the less so-called "dead time" the detector will have and the more ionizing events per unit of time it will be able to detect. Scintillators are used to detect electromagnetic waves or particles in many security and detection systems, including CT, X-ray, and gamma ray. There, a scintillator converts the energy to light of a wavelength which can be detected by photomultiplier tubes (PMTs) or P-N junction photodiodes.

Photodiodes are typically characterized by certain parameters, such as, among others, electrical characteristics, optical characteristics, current characteristics, voltage characteristics, and noise. Electrical characteristics predominantly comprise shunt resistance, series resistance, junction capacitance, rise or fall time and/or frequency response. Optical characteristics comprise responsivity, quantum efficiency, non-uniformity, and/or non-linearity. Photodiode noise may comprise, among others, thermal noise, quantum, photon or shot noise, and/or flicker noise.

In an effort to increase the signal to noise ratio and enhance the contrast of the signal, it is desirable to increase the light-induced current of photodiodes. Thus, photodiode sensitivity is enhanced while the overall quality of the photodiode is improved. Photodiode sensitivity is crucial in low-level light applications and is typically quantified by a parameter referred to as noise equivalent power (NEP), which is defined as the optical power that produces a signal-to-noise ratio of one at the detector output. NEP is usually specified at a given wavelength over a frequency bandwidth.

Photodiodes absorb photons or charged particles, facilitating detection of incident light or optical power and generating current proportional to the incident light, thus converting the incident light to electrical power. Light-induced current of the photodiode corresponds to the signal while "dark" or "leakage" current represents noise. "Dark" current is that current that is not induced by light, or that is present in the absence of light. Photodiodes process signals by using the magnitude of the signal-to-noise ratio.

Leakage current is a major source of signal offset and noise in current photodiode array applications. Leakage current flows through the photodiode when it is in a "dark" state, or in the absence of light at a given reverse bias voltage applied across the junction. Leakage current is specified at a particular value of reverse applied voltage. Leakage current is temperature dependent; thus, an increase in temperature and reverse bias results in an increase in leakage or dark current. A general rule is that the dark current will approximately double for every 10° C. increase in ambient temperature. It should be noted, however, that specific diode types can vary considerably from this relationship. For example, it is possible that leakage or dark current will approximately double for every 6° C. increase in temperature.

Various approaches have been used in the prior art to reduce, eliminate or control leakage current. For example, U.S. Pat. No. 4,904,861, assigned to Agilent Technologies, Inc., discloses "[an] optical encoder comprising: a plurality of active photodiodes in an array on a semiconductor chip; a code member having alternating areas for alternately illuminating and not illuminating the active photodiodes in response to movement of the code member; means connected to the active photodiodes for measuring current from the active photodiodes; and sufficient inactive photodiode area on the semiconductor chip at each end of the array of active photodiodes to make the leakage current to each end active photodiode of the array substantially equal to the leakage current to an active photodiode remote from an end of the array". Similarly, U.S. Pat. No. 4,998,013, also assigned to Agilent Technologies, Inc. discloses "means for shielding a photodiode from leakage current comprising: at least one active photodiode on a semiconductor chip; means for measuring current from the active photodiode; a shielding area having a photodiode junction substantially surrounding the active photodiode; and means for biasing the shielding area photodiode junction with either zero bias or reverse bias."

U.S. Pat. No. 6,670,258, assigned to Digirad Corporation, discloses "[a] method of fabricating a low-leakage current photodiode array comprising: defining frontside structures for a photodiode on a front side of a substrate; forming a heavily-doped gettering layer on a back surface of the substrate; carrying out a gettering process on the substrate to transport undesired components from the substrate to said gettering layer, and to form another layer in addition to said gettering layer, which is a heavily-doped, conductive, crystalline layer within the substrate; after said gettering process, removing the entire gettering layer; and after said removing, thinning the heavily-doped, conductive, crystalline layer within the substrate to create a native optically transparent, conductive bias electrode layer". Similarly, U.S. Pat. No. 6,734,416, also assigned to Digirad Corporation, discloses "[a] low-leakage current photodiode array comprising: a substrate having a front side and a back side; a plurality of gate regions formed near the front side of the substrate; a backside layer formed within the substrate, near the back side of the substrate, the backside layer having a thickness of approximately 0.25 to 1.0 micrometers and having a sheet resistivity of approximately 50 to 1000 Ohm per square."

U.S. Pat. No. 6,569,700, assigned to United Microelectronics Corporation in Taiwan, discloses "[a] method of reducing leakage current of a photodiode on a semiconductor wafer, the surface of the semiconductor wafer comprising a p-type substrate, a photosensing area for forming a photosensor of the photodiode, and a shallow trench positioned in the substrate surrounding the photosensing area, the method comprising: forming a doped polysilicon layer containing p-type dopants in the shallow trench; using a thermal process to cause the p-type dopants in the doped polysilicon layer to diffuse into portions of the p-type substrate that surround a bottom of the shallow trench and walls of the shallow trench; removing the doped polysilicon layer; filling an insulator into the shallow trench to form a shallow trench isolation (STI) structure; performing a first ion implantation process to form a first n-type doped region in the photosensing area; and performing a second ion implantation process to form a second n-type doped region in the photosensing area."

Also, U.S. Pat. No. 6,504,158, assigned to General Electric Company, discloses "a method of reducing leakage current in an imaging apparatus, including: providing a substrate with at least one radiation-sensitive imaging region therein; forming a guard region in the substrate at or immediately adjacent a cut edge of the substrate to reduce leakage current reaching the at least one radiation-sensitive imaging region from the cut edge when the imaging apparatus is in use; and electrically reverse biasing the at least one radiation-sensitive imaging region and the guard region relative to the substrate."

In certain applications, it is desirable to produce optical detectors having small lateral dimensions and spaced closely together. For example in certain medical applications, it is desirable to increase the optical resolution of a detector array in order to permit for improved image scans, such as computed tomography (CT) scans. However, at conventional doping levels utilized for diode arrays of this type, the diffusion length of minority carriers generated by photon interaction in the semiconductor is in the range of at least many tens of microns, and such minority carriers have the potential to affect signals at diodes away from the region at which the minority carriers were generated.

Thus, an additional disadvantage with conventional photodiode arrays is the amount and extent of crosstalk that occurs between adjacent detector structures, primarily as a result of minority carrier leakage current between diodes. The problem of crosstalk between diodes becomes even more acute as the size of the detector arrays, the size of individual detectors, the spatial resolution, and spacing of the diodes is reduced.

Various approaches have been used to minimize such crosstalk including, but not limited to, providing inactive photodiodes to balance the leakage current, as described in U.S. Pat. Nos. 4,904,861 and 4,998,013 to Epstein et al., the utilization of suction diodes for the removal of the slow diffusion currents to reduce the settling time of detectors to acceptable levels, as described in U.S. Pat. No. 5,408,122, and providing a gradient in doping density in the epitaxial layer, as described in U.S. Pat. No. 5,430,321 to Effelsberg.

In addition to leakage current and effects of crosstalk, noise is often a limiting factor for the performance of any device or system. In almost every area of measurement, the limit to the detectability of signals is set by noise, or unwanted signals that obscure the desired signal. As described above, the NEP is used to quantify detector noise. Noise issues generally have an important effect on device or system cost. Conventional photodiodes are particularly sensitive to noise issues. Like other types of light sensors, the lower limits of light detection for photodiodes are determined by the noise characteristics of the device.

As described above, the typical noise components in photodiodes include thermal noise; quantum or shot noise; and flicker noise. These noise components collectively contribute to the total noise in the photodiode. Thermal noise, or Johnson noise, is inversely related to the value of the shunt resistance of photodiode and tends to be the dominant noise component when the diode is operated under zero applied reverse bias conditions. Shot noise is dependent upon the leakage or dark current of photodiode and is generated by random fluctuations of current flowing through the device, which may be either dark current or photocurrent. Shot noise tends to dominate when the photodiode is used in photoconductive mode where an external reverse bias is applied across the device. As an example, detector noise generated by a planar diffused photodiode operating in the reverse bias mode is a combination of both shot noise and thermal noise. Flicker noise, unlike thermal or shot noise, bears an inverse relationship to spectral density. Flicker noise may dominate when the bandwidth of interest contains frequencies less than 1 kHz.

Secondary issues also contribute to dark noise and other noise sources that impact photodiode sensitivity. These include primarily determination and/or selection of apt active area specifications (geometry and dimensions), response speed, quantum efficiency at the wavelength of interest, response linearity, and spatial uniformity of response, among others.

In CT applications, such as those employed for baggage screening, it is desirable to have high density photodiode arrays with low dark current, low capacitance, high signal-to-noise ratio, high speed and low crosstalk.

As mentioned above, however, there are numerous problems with conventional photodiodes that attempt to achieve these competing and often conflicting characteristics. For example, in order to achieve low capacitance the photodiode can be fabricated on a high resistivity (on the order of 4000-6000 Ωcm) silicon material. Using a high resistivity material, however, causes the device to have high dark current.

FIG. 1 is a cross-sectional view of a conventional, prior art fishbone photodiode device 100. The photodiode array 100 comprises substrate wafer 105, which is a thick bulk wafer having an active area thickness on the order of 275-400 μm. As shown in FIG. 1 on the conventional fishbone photodiode device some photogenerated holes 110 move randomly in various directions, such as paths 115, in the thick active volume 106 of the bulk starting material wafer. Since minority carrier lifetime is limited, many of these photogenerated holes are lost due to recombination of holes and electrons in the bulk material, which causes a reduction in charge collection efficiency or responsivity of the photodiode.

In order to improve charge collection efficiency in this prior art fishbone photodiode device, the p+ diffused bones need to be placed relatively close to each other. This is disadvantageous, however, because a relatively large number of p+ fishbones is needed when placing the p+ diffused bones closer together, resulting in high junction capacitance. Typically, charge carriers that are photo-generated further from the P-N junction can diffuse toward the p+ diffused "bones" and be collected by the depletion region.

In addition, the fishbone photodiode device in the prior art as shown in FIG. 1 is disadvantageous because the high volume, thick active layer 105 that is used to fabricate the photodiode results in high dark current, since dark current is proportional to the overall volume of the active layer of the device.

In addition, the conventional photodiode array described above with respect to FIG. 1 is disadvantageous in that the photodiode tends to degrade in shunt resistance since the P-N junction is passivated by relatively thin antireflective layers, such as silicon oxide on the order of 150 Å and silicon nitride on the order of 425 Å.

The result is a fishbone photodiode having high noise characteristics, and thus, a poor signal to noise ratio.

What is needed is a photodiode array that can be fabricated on a thin active layer. In particular, what is needed is a photodiode array that can be fabricated on a thin active layer such as thin epi or thin direct-bonded layer, for fast rise time and better charge collection efficiency.

What is also needed is a photodiode array having reduced junction capacitance and reduced dark current, thus improving the signal to noise ratio of the photodiode array.

What is also needed is a photodiode array having reduced junction capacitance and reduced dark current, thus improving the signal to noise ratio of the photodiode array without sacrificing performance characteristics, such as quantum efficiency.

In addition, what is needed is economically, technically, and operationally feasible methods, apparatuses, and systems for manufacturing photodiode arrays on a thin active layer with reduced junction capacitance and reduced dark current effects.

In addition, what is needed is economically, technically, and operationally feasible methods, apparatuses, and systems for manufacturing photodiode arrays that can be used in computed tomography (CT) scanner applications that improve upon overall performance characteristics of the photodiode array and individual diode elements.

SUMMARY OF THE INVENTION

In one embodiment, the present invention is a photodiode device having a fishbone structure that can be fabricated on a thin active layer, such as epi or a thin direct-bonded layer and having improved device characteristics, including reduced junction capacitance, reduced dark current, and an improved signal-to-noise ratio.

In one embodiment, the present invention is a photodiode array comprising: a thin active layer substrate having at least a front side and a back side; a plurality of photodiodes integrally formed in the thin active layer substrate forming said array; a plurality of metal contacts provided on said front side and said back side, wherein the fabrication of said array comprises: coating said front side of said substrate with oxide via mask oxidation; masking said front side of said substrate with an n+ lithography mask; selectively etching the oxide coating on said front side of said thin active layer substrate using the n+ lithography mask and completely etching the oxide coating on the back side of the substrate; diffusing a n+ layer on said front side and said back side of said substrate forming a n+ region; performing a drive-in oxidation on said front side and said back side of said substrate; masking said front side of said substrate with a p+ lithography mask; selectively etching the oxide coating on said front side of said substrate wafer using the p+ lithography mask; diffusing a p+ layer on said front side of said substrate; applying a drive-in oxidation layer on said front side and said back side of said substrate; masking said front side of said substrate to form at least one active area etch pattern; selectively etching the oxide coating on said front side of said substrate using said active area etch pattern and etching the oxide coating on said back side of said substrate completely; applying at least one antireflective layer on said front side and said back side of said substrate; masking said front side of said substrate wafer using a contact window mask; selectively etching the front side of the substrate using said contact window mask to form at least one contact window and completely etching the at least one antireflective layer from the back side of the substrate; metallizing said front side and said back side of said substrate; and masking and selectively etching said front side of said substrate to form metal contacts.

In one embodiment, the thin active layer has a thickness of 15 μm. In one embodiment, an oxide layer is retained on at least a portion of the front side of the thin active layer to increase the structural rigidity of the device. Optionally, the photodiode of the present invention further comprises a mechanical support bonded to said back side of said thin active area layer substrate. In one embodiment, the mechanical support comprises n+ silicon substrate.

In one embodiment, the p+ mask pattern is a fishbone pattern. In one embodiment, the fishbone pattern p+ mask comprises a plurality of p+ bones further defined by a p+ periphery frame bone. In one embodiment, the distance between adjacent p+ bones in said fishbone pattern is 700 μm.

In one embodiment, the antireflective coating layer is a thin film material, wherein the thin film material is one of an oxide, a sulfide, a fluoride, a nitride, a selenide, or a metal. In one embodiment, the antireflective coating is a silicon dioxide antireflective having a thickness of 150 Å. In another embodiment, the antireflective coating is a silicon nitride antireflective having a thickness of 425 Å.

In another embodiment, the present invention is a photodiode array comprising: a thin active layer substrate having at least a front side and a back side; a mechanical support bonded to said back side of said thin active area substrate; a plurality of photodiodes integrally formed in the thin active layer substrate forming said array; a plurality of metal contacts provided on said front side and said back side, wherein the fabrication of said array comprises: coating said front side of said substrate with oxide via mask oxidation; masking said front side of said substrate with an n+ lithography mask; selectively etching the oxide coating on said front side of said thin active layer substrate using the n+ lithography mask and completely etching the oxide coating on the back side of the substrate; diffusing a n+ layer on said front side and said back side of said substrate forming a n+ region; performing a drive-in oxidation on said front side and said back side of said substrate; masking said front side of said substrate with a p+ lithography mask; selectively etching the oxide coating on said front side of said substrate wafer using the p+ lithography mask; diffusing a p+ layer on said front side of said substrate; applying a drive-in oxidation layer on said front side and said back side of said substrate; masking said front side of said substrate to form at least one active area etch pattern; selectively etching the oxide coating on said front side of said substrate using said active area etch pattern and etching the oxide coating on said back side of said substrate completely; applying at least one antireflective layer on said front side and said back side of said substrate; masking said front side of said substrate wafer using a contact window mask; selectively etching the front side of the substrate using said contact window mask to form at least one contact window and completely etching the at least one antireflective layer from the back side of the substrate; metallizing said front side and said back side of said substrate; and masking and selectively etching said front side of said substrate to form metal contacts.

In yet another embodiment, the present invention is a photodiode array comprising: a thin active area substrate having at least a front side and a back side; a plurality of diode elements integrally formed in the substrate forming said array, wherein each diode element has a p+ fishbone pattern on said front side, further comprising at least one p+ bone and a p+ bone frame periphery, and wherein each p+ bone is protected by a thick oxide layer, and a plurality of front surface cathode and anode contacts, wherein said protected p+ fishbone pattern substantially increases the structural integrity and reduces junction and leakage current between adjacent photodiodes.

In yet another embodiment, the present invention is a photodiode array comprising: a thin active area substrate having at least a front side and a back side; a mechanical support bonded to said back side of said thin active area substrate; a plurality of diode elements integrally formed in the substrate forming said array, wherein each diode element has a p+ fishbone pattern on said front side, further comprising at least one p+ bone and a p+ bone frame periphery, and wherein each p+ bone is protected by a thick oxide layer, and a plurality of front surface cathode and anode contacts, wherein said protected p+ fishbone pattern substantially increases the structural integrity and reduces junction and leakage current between adjacent photodiodes.

BRIEF DESCRIPTION OF THE DRAWINGS

These and other features and advantages of the present invention will be appreciated, as they become better understood by reference to the following detailed description when considered in connection with the accompanying drawings, wherein:

FIGS. 4A through 4I depict cross-sectional, planar views of manufacturing steps for fabricating the fishbone photodiode of the present invention, shown in FIG. 3A;

DETAILED DESCRIPTION OF THE INVENTION

Figure 1:
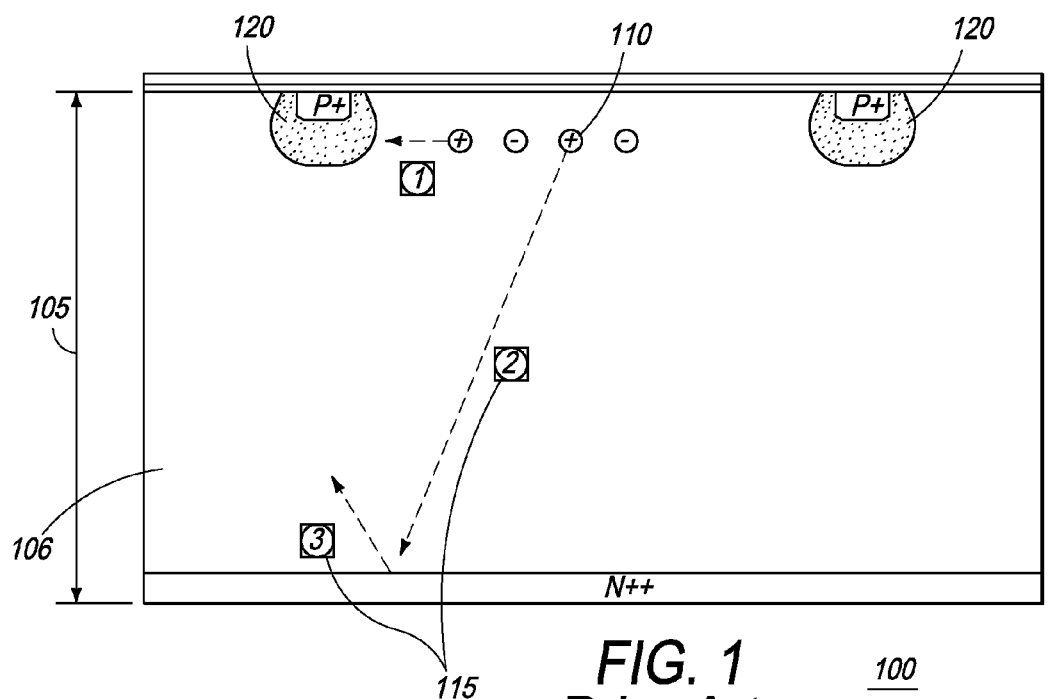
FIG. 1 is a cross-sectional view of a conventional fishbone photodiode device.

The present invention is directed towards a photodiode array having a fishbone design that can be fabricated on a material having intermediate resistivity, such as, but not limited to 1000 Ωcm. Such devices are commonly used in CT and X-ray applications. In particular, the present invention is directed towards a fishbone structure photodiode, comprising p+ diffused areas that are small and narrow, resembling fingers or fishbones. Since the p+ diffused areas areas are reduced, the capacitance of the resultant photodiode is less than the capacitance of a standard diffused photodiode were the full active area is diffused.

The photodiode array of the present invention thus overcomes the disadvantages of the conventional photodiodes described above by placing the p+ fishbones at a greater distance from each other, thus necessitating the use of fewer p+ fishbones, reducing the overall junction capacitance. In addition, a thin active layer is employed, reducing leakage or "dark" current, since dark current is proportional to the overall volume of the active layer. In addition, the present invention uses a photomask that serves to provide a thick oxide region or layer on top of the P-N junction prior to the growth/deposition of the relatively thin AR layers. Since the junctions are passivated with a thick oxide layer, the device has more structural rigidity and integrity and is less prone to junction degradation. In another embodiment of the present invention, the thin active layer is placed on a mechanical support for added strength and durability.

Thus, the present invention is directed toward a detector structure, detector arrays, and a method of detecting incident radiation. In particular, the present invention is directed toward a fishbone photodiode device that can be fabricated on a thin wafer active area, thus reducing leakage or "dark" current. The present invention is also directed toward a fishbone photodiode device that has reduced junction capacitance owing to the distance between adjacent p+ fishbones, and the relative number of p+ fishbones used to fabricate the device. Because of the reduced dark current and reduced junction capacitance, the overall signal-to-noise ratio of the photodiode array is improved. In addition, the photodiode of the present invention has faster rise times and better charge collection efficiency.

The present invention is also directed towards a photodiode array having reduced junction capacitance and reduced dark current, thus improving the signal to noise ratio of the photodiode array without sacrificing performance characteristics, such as quantum efficiency.

In one embodiment, the present invention is directed toward a fishbone photodiode device that can be fabricated on a thin active layer and that additionally has a thick oxide region on top of the P-N junction prior to the growth/deposition of the relatively thin AR layers, further lending structural integrity to the photodiode device.

The present invention is also directed toward a photodiode array that can be used in computed tomography (CT) scanner applications that improve upon overall performance characteristics of the photodiode array and individual diode elements.

While reference may be made to specific embodiments, such as the use of the photodiode array in CT scanning applications, it should be understood to those of ordinary skill in the art that a photodiode array as described herein may be used in any type of imaging application, including, but not limited to mobile and/or cargo screening systems, people screening systems, and the like.

Reference will now be made to specific embodiments of the present invention. The embodiment described herein is not a general disavowal of any one specific embodiment or used to limit the claims beyond the meaning of the terms used therein. In addition, various modifications to the described embodiment(s) will be readily apparent to those of ordinary skill in the art and the disclosure set forth herein may be applicable to other embodiments and applications without departing from the spirit and scope of the present invention.

Figure 2:
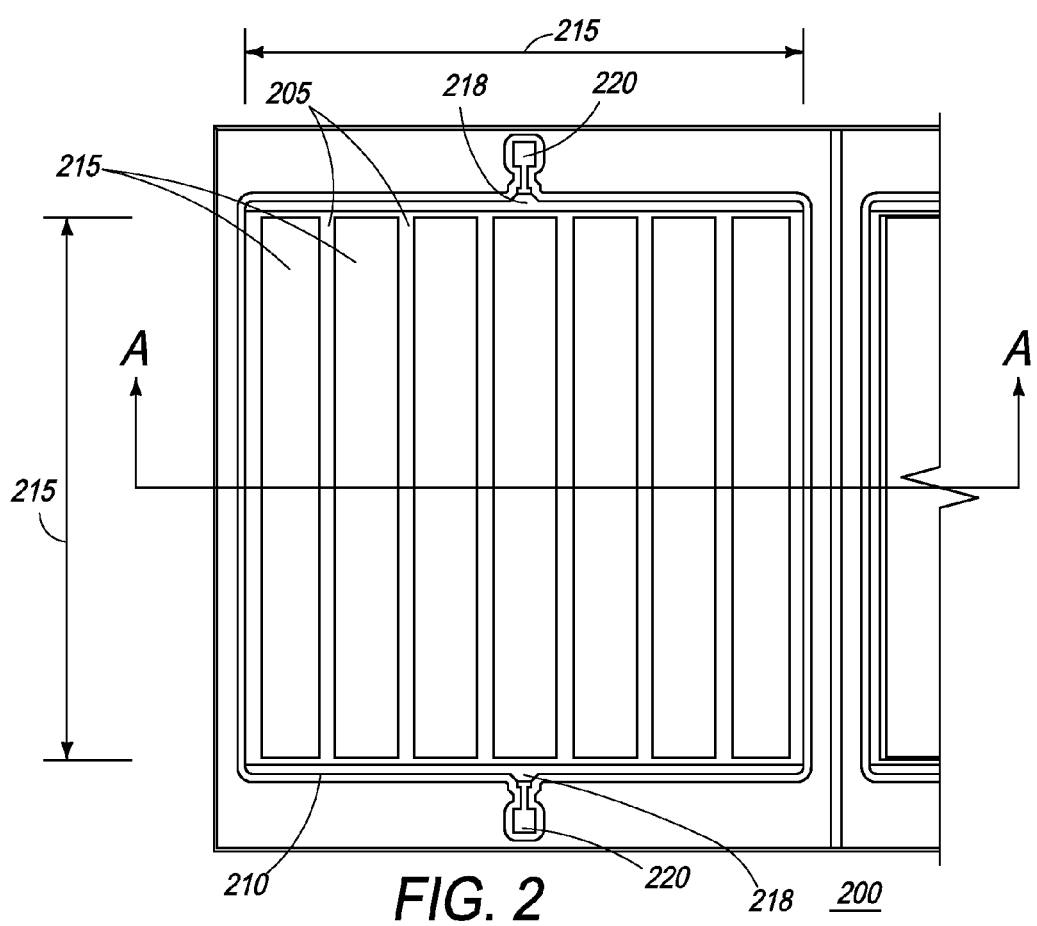
FIG. 2 is a top view of one embodiment of a photodiode fabricated in accordance with the present invention.

FIG. 2 is a top surface view of one embodiment of a photodiode 200 fabricated in accordance with the present invention. As shown in FIG. 2, a p+ mask is employed to create and form a p+ fishbone pattern, comprising p+ bones 205 further defined by a periphery frame bone 210.

Unlike conventional fishbone devices, the present invention employs a wider gap between adjacent p+ diffusion bones. In one embodiment, the gap or distance between adjacent p+ bones 205 is 700 µm. The distance from the center of one p+ diffusion bone to the center of an adjacent p+ diffusion bone is referred to as the "pitch". In one embodiment, the pitch is 714 µm.

Fishbone photodiode 200 further comprises active area 215, contact windows 218, and metallized areas 220, which are described in further detail below with respect to the fabrication steps. In one embodiment, the overall starting material active area 215 is 5 mm×5 mm.

It should be noted herein that typically, the active area in a detector is either of a round or square shape. There is no restriction on the shape of these active areas, however. Many applications may require triangular, radial, or trapezoidal shapes. Conventional photodiodes are manufactured via standard wafer fabrication techniques involving methods of masking and photoetching; thus, it is relatively simple to create a unique geometry. The geometric size and shape of the active area can be held to tolerances of 2 microns. As described herein, the term "region" is used interchangeably with the term "area" and refers to discrete portions within the photodiode chip.

The fabrication of the photodiode described with respect to FIG. 2 will be described in greater detail with respect to the manufacturing steps shown FIGS. 4A-4I and the individual mask elements, as shown in FIGS. 5A-5E.

Figure 3A:
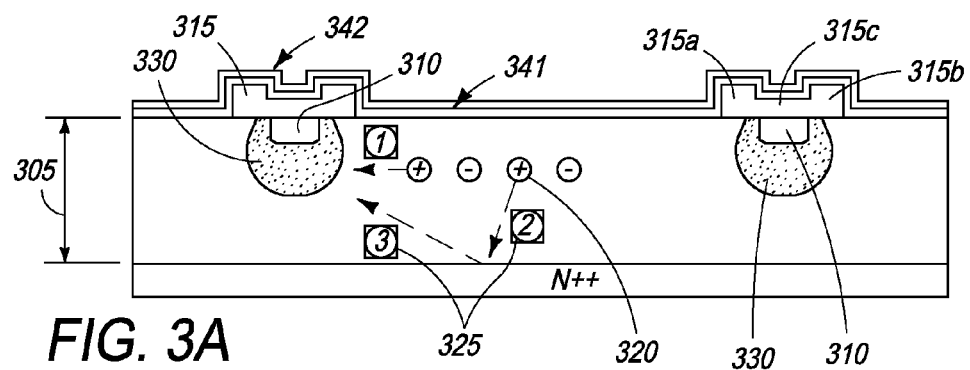
FIGS. 3A, 3B, and 3C represent cross-sectional views of various embodiments of the fishbone photodiode fabricated in accordance with the present invention.
Figure 3B:
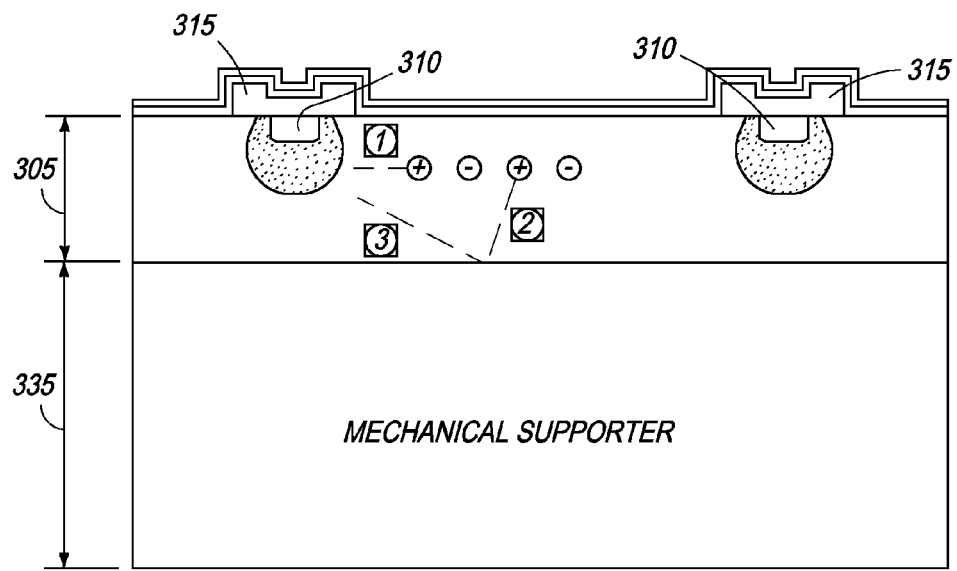
Figure 3C:
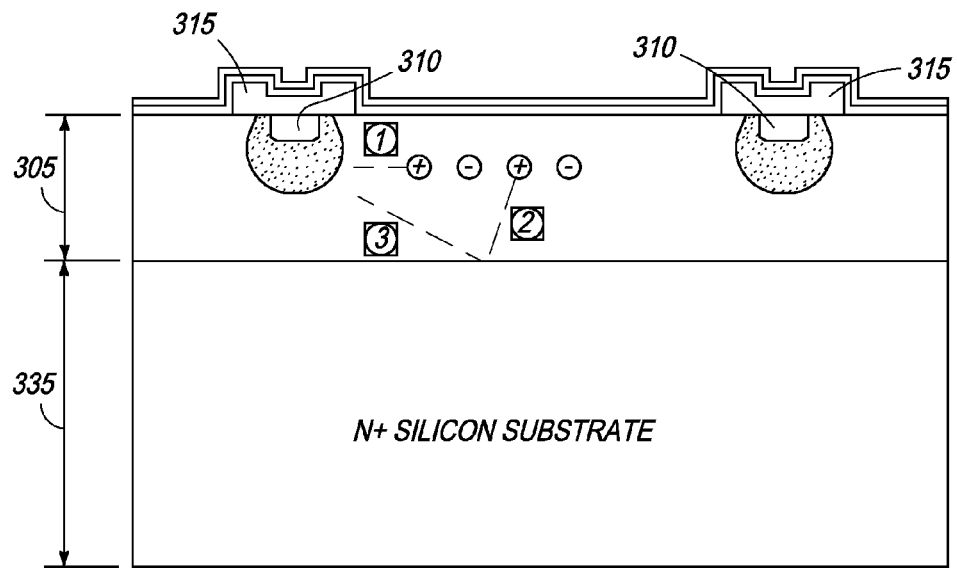

FIGS. 3A, 3B, and 3C represent cross-sectional views of various embodiments of the fishbone photodiode fabricated in accordance with the present invention. Now referring to FIG. 3A, in one embodiment, the photodiode array 300 of the present invention is fabricated on thin active layer 305. In one embodiment, thin active layer 305 has a thickness of 15 µm. The thin active layer results in a decrease in the leakage or dark current of the device, because the dark current is proportional to the volume of the active layer of the device. As shown in FIG. 3A, quantum efficiency is retained because photogenerated holes 320 need move only a short distance or path 325 before getting collected by depletion region 330. In one embodiment, depletion region 330 has a surface width of 5 µm.

In one embodiment, the photodiode array of the present invention comprises a p+ fishbone pattern, wherein adjacent p+ fishbones 310 are placed at a wide distance from each other, necessitating the use of fewer fishbones than the conventional fishbone photodiode array described above. In one embodiment, the distance between adjacent fishbones 310 is 700 µm. In one embodiment, the distance between the centers of two adjacent fishbones 310, or pitch, is 714 µm.

In another embodiment, the fishbone photodiode of the present invention is fabricated with a thick oxide region 315 on top of each of the P-N junctions prior to the growth/deposition of the relatively thin anti-reflective (AR) layers 341, 342. In one embodiment, thick oxide regions 315 comprise approximately 8000 Å of silicon oxide and approximately 425 Å of silicon nitride. In one embodiment, the thick oxide regions or layer 315 comprises three sections 315a, 315b, and 315c. Sections 315a and 315b comprise the end sections of thick oxide regions or layer 315 and have a width of 20 µm. Section 315c is the middle section of thick oxide regions 315, directly on top of the p+ fishbone, and, in one embodiment, is thinner than end sections 315a and 315b. Since the P-N junctions are passivated with the thick oxide regions 315, the device has more structural rigidity and integrity and is less prone to junction degradation.

In one embodiment of the photodiode array of the present invention, AR layer 341 comprises silicon oxide and has a thickness of 150 Å. In one embodiment, AR layer 342 comprises silicon nitride and has a thickness of 425 Å.

Now referring to FIG. 3B, in one embodiment, the present invention is a fishbone photodiode device that can be fabricated on a thin active layer 305, wherein the thin active layer 305 is placed on a mechanical support 335 for added strength and durability. In one embodiment, mechanical support 335 comprises CZ silicon, FZ silicon, quartz, or any other similar mechanical support material that does not affect device performance characteristics. In one embodiment, the mechanical support 335 has a thickness of 250 µm. In one embodiment, and now referring to FIG. 3C, the mechanical support 335 is n+ silicon substrate.

FIGS. 4A through 4I depict side planar views of manufacturing steps for fabricating the fishbone photodiode 400 of the present invention, as shown in FIG. 3C, where a n+ silicon substrate mechanical support is employed. It should be understood to those of ordinary skill in the art that while the method of manufacturing the fishbone photodiode of the present invention is described with respect to the use of the mechanical support, the mechanical support is optional and the manufacturing steps can be employed without the support.

Modifications or alterations to the manufacturing steps, their corresponding details, and any order presented may be readily apparent to those of ordinary skill in the art. Thus, the present invention contemplates many possibilities for manufacturing the photodiode array of the present invention and is not limited to the examples provided herein.

Referring now to FIG. 4a, the starting material for fabricating photodiode 400 is, in one embodiment, thin active layer 405 on n+ silicon substrate wafer 410. Thin active layer 405 is preferably silicon, n-type, and has a resistivity of approximately 1,000 $\Omega$Cm. In one embodiment, the thin active layer is thin epi or a thin direct-bonded active layer. In one embodiment, thin active layer 405 has a thickness of 15 µm. In one embodiment, the n+ silicon substrate wafer 410 has a thickness of 250 µm. In one embodiment, the overall thickness of the starting material is 265 µm. While it is preferred that the substrate wafer be comprised of silicon, one of ordinary skill in the art would appreciate that any suitable mechanical support, which can be processed in accordance with the processing steps of the present invention, may be used.

In addition, both thin active layer 405 and substrate wafer 410 can optionally be polished on both sides to allow for greater conformity to parameters, surface flatness, and specification thickness. It should be understood by those of ordinary skill in the art, however, that the above specifications are not binding and that the type of material and resistivity can easily be changed to suit the design, fabrication, and functional requirements of the present invention.

Referring back to FIG. 4A, in step 450, both thin active layer 405 and n+ silicon substrate 410 are subjected to a standard mask oxidation process that grows an oxide layer 415 on the front side of thin active layer 405 and the back side of n+ silicon substrate 410. In one embodiment, the oxide layer 415 comprises silicon oxide ($SiO_2$) having a thickness of approximately 8000 Å. The thick oxide layer 415 will serve to protect the P-N junction, as described with respect to FIGS. 2 and 3a. In one embodiment, thermal oxidation is employed to achieve mask oxidation. Standard mask oxidation is well known to those of ordinary skill in the art and will not be described in further detail herein.

Now referring to FIG. 4B, after the standard mask oxidation is complete, in step 455, the device is subjected to n+ photolithography on the front side of thin active layer 405. In one embodiment, photolithography comprises employing a photoresist layer to create a specific pattern on the surface of thin active layer 405.

Generally, the photoresist layer is a photosensitive polymeric material for photolithography and photoengraving that can form a patterned coating on a surface. After selecting a suitable material and creating a suitable photoresist pattern, a thin photoresist layer is applied to the front side of thin active layer 405. In one embodiment, the photoresist layer is applied via a spin coating technique. Spin coating is well known to those of ordinary skill in the art and will not be described in detail herein.

Figure 5A:
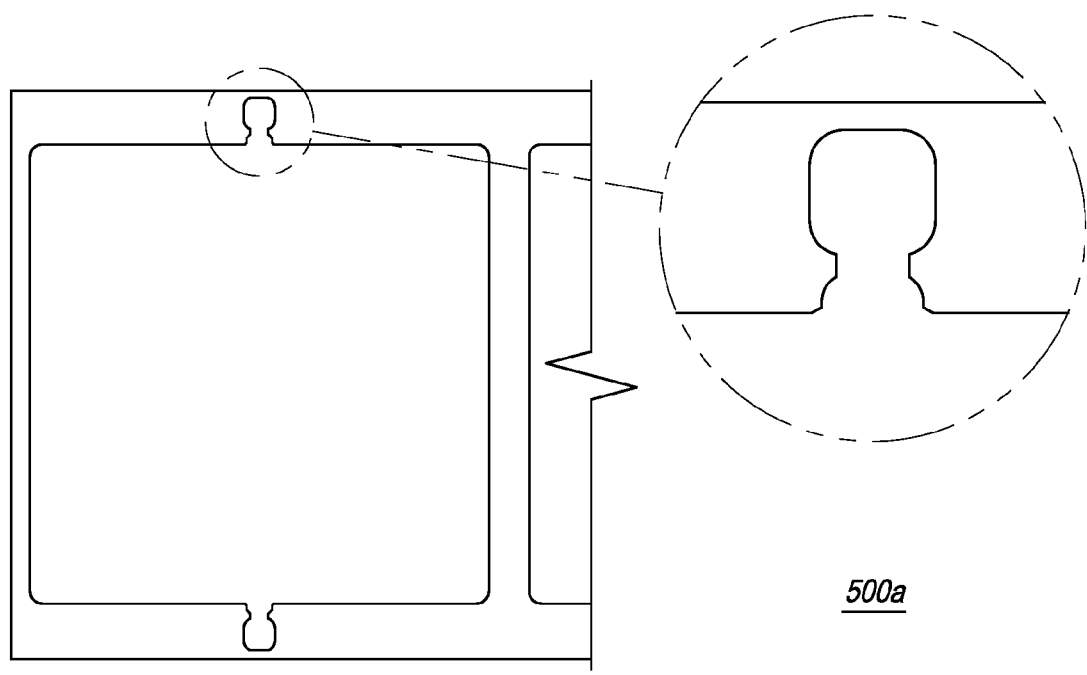
FIG. 5A depicts an exemplary embodiment of an n+ mask used during manufacturing the fishbone photodiode of the present invention.

In one embodiment, n+ masking is used to form a suitable photoresist layer pattern. An exemplary n+ mask is shown in FIG. 5A. As shown in FIG. 5A, the n+ masking results in a specific pattern on thin active layer 405. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask shown in FIG. 5A comprises a plurality of diffusion windows with appropriate geometrical and dimensional specifications.

Referring back to FIG. 4B, the photoresist coated thin active layer 405 is aligned with the n+ mask and appropriately treated to reveal n+ diffusion regions. An intense light, such as UV light, is projected through the mask, exposing the photoresist layer in the pattern of the n+ mask. The n+ mask allows selective irradiation of the photoresist on the thin active layer. Regions that are exposed to radiation are hardened while those that are reserved for diffusion remain shielded by the n+ mask and easily removed by etching.

The exposed and remaining photoresist is then subjected to a suitable chemical or plasma etching process to reveal the pattern transfer from the mask to the photoresist layer. The etching process is employed to remove the silicon oxide layer from the front side of the thin active layer and the back side of the n+ substrate. In one embodiment, the pattern of the photoresist layer and/or n+ mask defines a plurality of regions 420, on the front side of the thin active layer, devoid of the oxide layer deposited in step 450 and ready for n+ diffusion.

Now referring to FIG. 4C, in step 460, the front side of thin active layer 405 and the back side of n+ silicon substrate 410 are subjected to n+ diffusion followed by drive-in oxidation. Generally, diffusion facilitates propagation of a diffusing material through a host material. In step 460, an appropriate amount of dopant atoms, such as phosphorous, is deposited onto at least a portion of the front side of thin active layer 405 and the entire back side of the n+ silicon substrate 410. The substrate is then subjected to a drive-in oxidation process that is used to redistribute the dopant atoms and deposit them deeper into the front side of thin active layer 405 and back side of silicon substrate 410. In one embodiment, this process fills the plurality of regions 420 devoid of the oxide layer via deep diffusion with n+ dopant. In addition, exposed surfaces, such as the front side of thin active layer 405 and back side of silicon substrate 410, are covered with oxide layer 425. In one embodiment, oxide layer 425 has a thickness of approximately 3000 Å.

Referring now to FIG. 4D, in step 465, the front side of thin active layer 405 is subjected to a p+ lithography process, creating a plurality of regions 430, which are exposed silicon surfaces devoid of any layers. As with any conventional lithography process, p+ lithography comprises at least the following tasks, but not limited to such tasks: substrate preparation; photoresist application; soft baking; mask alignment; exposure; development; hard backing; and etching. In addition, various other chemical treatments may be performed.

Figure 5B:
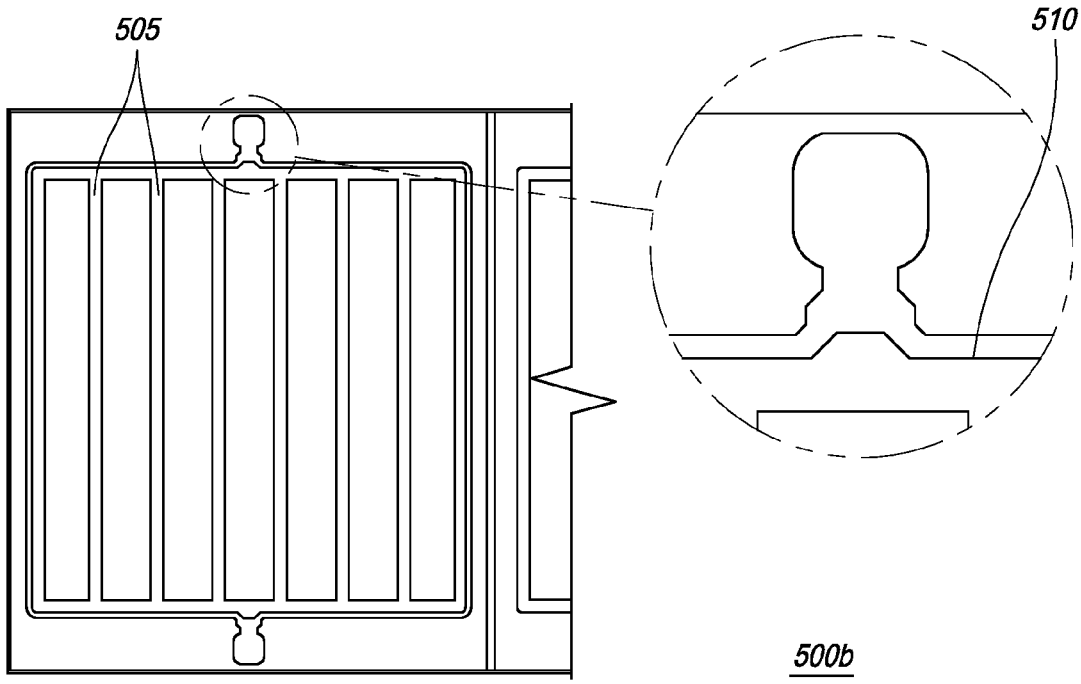
FIG. 5B depicts an exemplary embodiment of a p+ mask used during manufacturing the fishbone photodiode of the present invention.

In one embodiment, the p+ mask shown in FIG. 5b is employed. In one embodiment, the p+ mask pattern is a fishbone pattern that comprises p+ bones 505, further defined by a periphery frame bone 510. In one embodiment, bones 505 have a width of 0.014 mm. In one embodiment, the distance between adjacent p+ bones is 700 µm. In one embodiment, the pitch is 714 µm. The p+ masking process is similar to that delineated with respect to the n+ masking process described earlier and will not be repeated in detail herein.

The p+ masking process further comprises deposition and drive-in oxidation, as shown in FIG. 4e, allowing for predefined and/or predetermined thermal budget in accordance with the principles of the present invention. Now referring to FIG. 4E, in step 470, an appropriate amount of dopant atoms, such as boron, is deposited onto at least a portion of the front side of thin active layer 405. The thin active layer 405 is then subjected to a drive-in oxidation process that is used to redistribute the dopant atoms and deposit them deeper into the front side of thin active layer 405. In one embodiment, this process fills the plurality of regions 430 devoid of the oxide layer via deep diffusion with p+ dopant. In one embodiment, the p+ regions have a width of 0.014 mm. In one embodiment, the distance between adjacent p+ bones is 700 µm. In one embodiment, the pitch, or distance between the centers of any two adjacent p+ bones, is 714 µm.

In addition, exposed surfaces, such as the front side of thin active layer 405 and back side of silicon substrate 410, are covered with an oxide layer 431. In one embodiment, oxide layer 431 has a thickness of approximately 2700 Å.

In step 475, as shown in FIG. 4F, the device wafer undergoes active area photolithography and subsequent selective oxide etching to expose a plurality of active area regions 435 on the front side of thin active layer 405. In one embodiment, an active area mask, such as that shown in FIG. 5C is employed. The active area specifications, among other parameters, form the significant performance characteristics of the photodiode of the present invention.

Referring back to FIG. 4F, a plurality of thick oxide covered regions 440 are retained on top of the P-N junction. In one embodiment, thick oxide regions 440 comprise approximately 8000 Å of silicon oxide and approximately 425 Å of silicon nitride. In one embodiment, the thick oxide regions or layer 440 comprises three sections 440a, 440b, and 440c. Sections 440a and 440b comprise the end sections of thick oxide regions or layer 440 and have a width of 20 mm. Section 440c is the middle section of thick oxide regions 440, directly on top of the p+ fishbone, and, in one embodiment, is thinner than end sections 440a and 440b. Since the P-N junctions are passivated with the thick oxide regions 440, the device has more structural rigidity and integrity and is less prone to junction degradation.

In one embodiment, the back side of the n+ silicon substrate 410 is etched completely so that it is devoid of any oxide layer.

In step 480, as shown in FIG. 4G, dual anti-reflective (AR) layers 441 and 442 are grown on the front side of thin active layer 405 and silicon substrate 410. Persons of ordinary skill in the art would appreciate that various anti-reflective coating designs, such as 1 layer, 2 layer, 3 layer, and 4+ layer may be employed. By way of example, and by no means limiting, the dual layer anti-reflective coating design adopted herein utilizes a combination of thin film materials, such as oxides, sulfides, fluorides, nitrides, selenides, and metals, among others. In one embodiment of the photodiode array of the present invention, AR layer 441 comprises silicon oxide and has a thickness of 150 Å. In one embodiment, AR layer 442 comprises silicon nitride and has a thickness of 425 Å.

Although the thickness of the AR layers of the present invention are optimized for use with LSO/LYSO scintillator crystals, it should be appreciated by those of ordinary skill in the art that the thickness of the AR layer employed in the present invention can be tailored to obtain minimum reflection loss at different wavelengths for different applications and can thus be used with any scintillator material.

For example, but not limited to such example, certain photodiode arrays employ a scintillator material such as Cadmium Tungstate. Cadmium Tungstate (CdWO4 or CWO) is a dense, chemically inert solid which is used as a scintillation crystal to detect gamma rays. The crystal is transparent and emits light when it is hit by gamma rays and X-rays, making it useful as a detector of ionizing radiation. Its peak scintillation wavelength is 520 nm (with emission range between 330-540 nm), and efficiency of 13000 photons/MeV.

Now referring to FIG. 4H, in step 485, a contact etch mask is used to etch a plurality of contact windows 445 into the front side of the thin active layer 405. Contact lithography, well known to those of ordinary skill in the art, involves printing an image or pattern via illumination of a photomask in direct contact with a substrate coated with an imaging photoresist layer. Typically, a contact window is an aperture defined in a surface passivation layer through which device metallization develops contact with circuit elements. The contact windows 445 formed on the front side of the thin active layer 405 by using standard semiconductor technology photolithography techniques. The contact window oxide can then be removed by either standard wet or standard dry etching techniques as are well known to those of ordinary skill in the art.

Figure 5C:
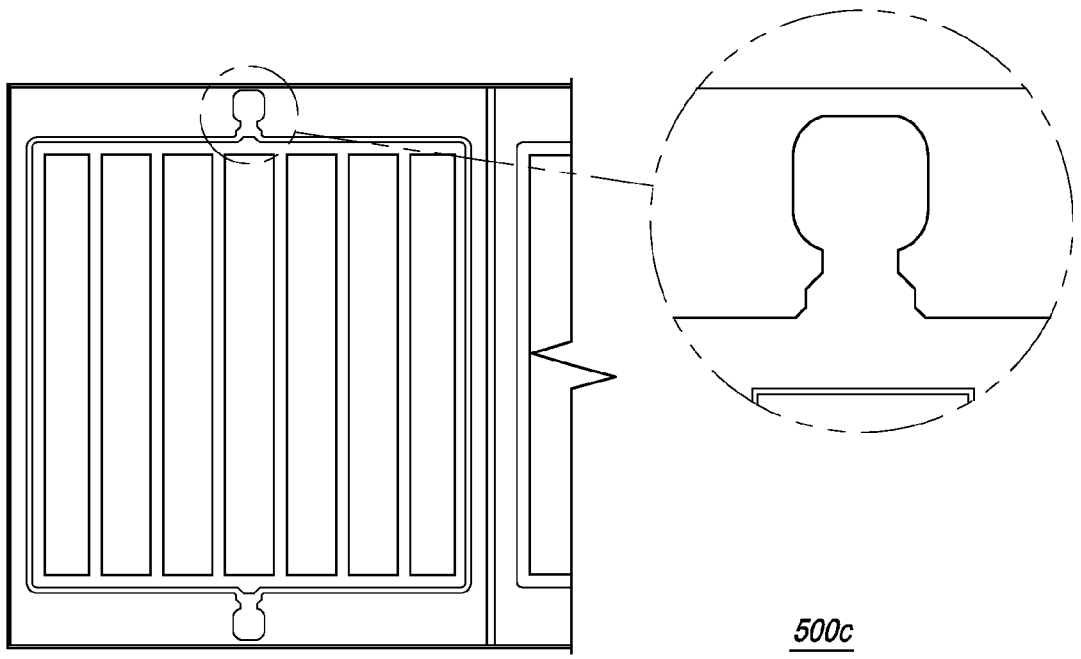
FIG. 5C depicts an exemplary embodiment of an active area mask used during manufacturing the fishbone photodiode of the present invention.
Figure 5D:
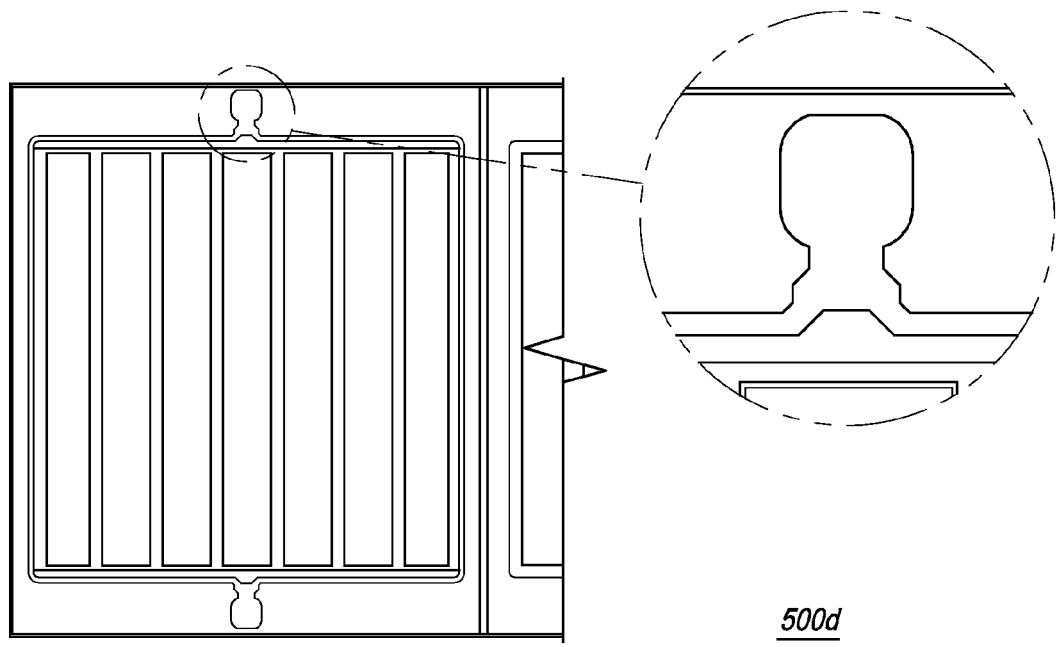
FIG. 5D depicts an exemplary embodiment of a contact mask used during manufacturing the fishbone photodiode of the present invention.

More specifically, and not limited to such example, in one embodiment of the photodiode array of the present invention, a contact window mask such as that shown in FIG. 5D is first applied. In one embodiment, the contact window mask is a dark field mask, which is used to remove the silicon oxide layer in regions requiring contacts. Using the contact mask, at least one of contact windows 445 is opened through the protective and passivation layers deposited on the surface of the thin active layer by etching the oxide from regions 445 that remain exposed by the mask. In one embodiment, contact window etching is achieved via a chemical etching process, wherein the wafer is immersed in buffered oxide etch (BOE), a HF acid-based solution for intervals sufficient to remove the layers exposed by the contact window mask.

Figure 4I:
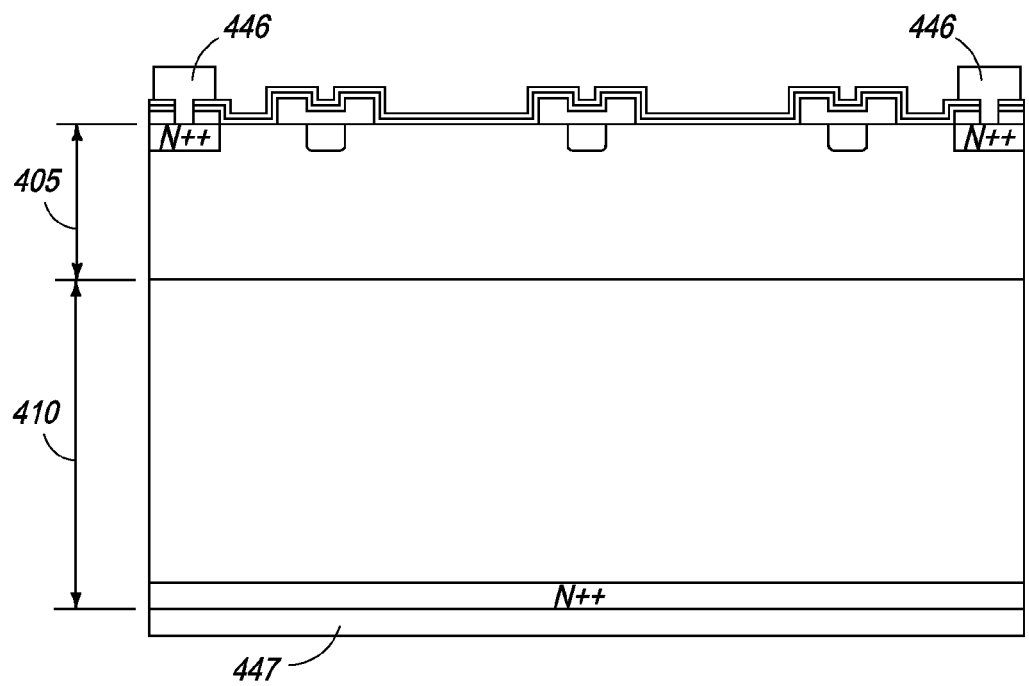

Referring now to FIG. 4I, in step 490, thin active layer 405 and n+ silicon substrate 410 are subjected to a metal deposition process to provide metal contacts 446 on the front side of thin active layer 405 and a metal layer 447 on the back side of the n+ silicon substrate wafer for creating electrical connections. In the metal deposition process, also called metallization, metal layers are deposited on the wafer to create conductive pathways. The most common metals include aluminium, nickel, chromium, gold, germanium, copper, silver, titanium, tungsten, platinum, and tantalum. Selected metal alloys may also be used. Metallization is often accomplished with a vacuum deposition technique. The most common deposition process include filament evaporation, electron-beam evaporation, flash evaporation, induction evaporation, and sputtering, followed by metal masking and selective etching.

Figure 5E:
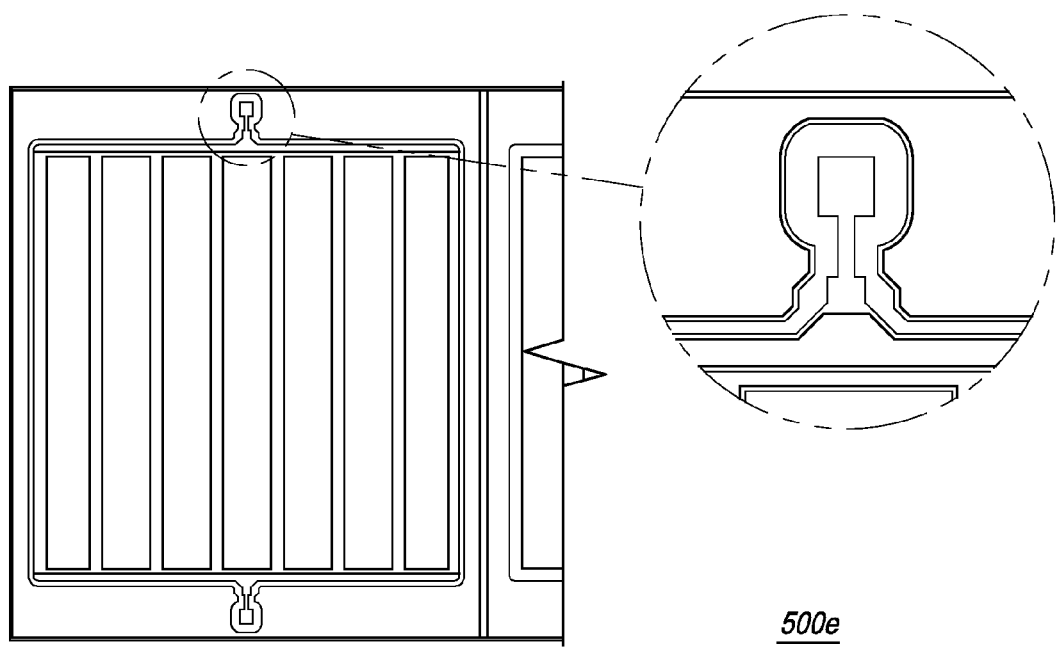
FIG. 5E depicts an exemplary embodiment of a metal mask used during manufacturing the fishbone photodiode of the present invention.

In one embodiment, the metal mask shown in FIG. 5E is employed. In one embodiment, metal contacts 446 are selectively etched on the front side of the photodiode 400 using the metal mask shown in FIG. 5E. Metal etching can be performed in a variety of methods, including, but not limited to abrasive etching, dry etching, electroetching, laser etching, photo etching, reactive ion etching (RIE), sputter etching, and vapor phase etching.

The above examples are merely illustrative of the structure and manufacturing steps of the photodiode array of the present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention may be modified within the scope of the appended claims.

We claim:

1. A photodiode array comprising:
   a thin active layer substrate having at least a front side and a back side;
   a plurality of photodiodes integrally formed in the thin active layer substrate forming said array, wherein each of said photodiodes comprises a p+ region, each of said p+ regions generating a depletion region within said thin active layer substrate, wherein each p+ region creates a p-n junction;
   a plurality of metal contacts provided on said front side and said back side; and
   an oxide layer formed on said front side and above said depletion region, wherein said oxide layer has a first thickness and a second thickness, wherein said second thickness is thinner than said first thickness, and wherein said second thickness is positioned directly above, and completely extends across, each of said p+ regions.

2. The array of claim 1, wherein a plurality of said p+ regions form a fishbone pattern.

3. The array of claim 2 wherein the fishbone pattern comprises a plurality of p+ bones further defined by a p+ periphery frame bone.

4. The array of claim 1, further comprising an antireflective coating layer, wherein said antireflective coating layer is a thin film material.

5. The array of claim 4 wherein said thin film material is one of an oxide, a sulfide, a fluoride, a nitride, a selenide, or a metal.

6. The array of claim 4 wherein said antireflective coating is a silicon dioxide antireflective coating having a thickness of 150 Å.

7. The array of claim 4 wherein said antireflective coating is a silicon nitride antireflective coating having a thickness of 425 Å.

8. The array of claim 1 wherein said oxide layer increases the structural rigidity of the photodiode array.

9. The array of claim 1 further comprising a mechanical support bonded to said back side of said thin active layer substrate.

10. The array of claim 9 wherein the mechanical support comprises n+ silicon substrate.

11. A photodiode array comprising:
    a thin active layer substrate having at least a front side and a back side wherein said thin active layer has a thickness of 15 μm;
    a mechanical support bonded to said back side of said thin active layer substrate;
    a plurality of photodiodes integrally formed in the thin active layer substrate forming said array, wherein each of said photodiodes comprises a p+ region, each of said p+ regions generating a depletion region within said thin active layer substrate, wherein each said p+ region is separated by a distance of 700 μm, and wherein each p+ region creates a p-n junction; and
    an oxide layer formed on said front side and above said depletion region, wherein said oxide layer has a first thickness and a second thickness, wherein said second thickness is thinner than said first thickness, and wherein said second thickness is positioned directly above, and completely extends across, each of said p+ regions.

12. The array of claim 11 further comprising a mechanical support bonded to said back side of said thin active layer substrate, wherein the mechanical support comprises n+ silicon substrate.

13. A photodiode array comprising:
    a thin active area substrate having at least a front side and a back side wherein said thin active layer has a thickness of 15 μm;
    a plurality of diode elements integrally formed in the thin active area substrate forming said array, wherein each diode element has a p+ fishbone pattern proximate to said front side, further comprising at least one p+ bone and a p+ bone frame periphery, and wherein each of said p+ bones generates a depletion region within said thin active area substrate, and wherein each said p+ bones is separated by a distance of 700 μm; and
    a plurality of front surface cathode and anode contacts,
    wherein said p+ fishbone pattern is protected by an oxide layer formed on said front side and above said depletion region, wherein said oxide layer has a first thickness and a second thickness, wherein said second thickness is thinner than said first thickness, and wherein said second thickness is positioned directly above, and completely extends across, each of said p+ fishbones and protects each of said p+ fishbones.

14. The array of claim 13 further comprising an antireflective coating layer.

15. The array of claim 14 wherein said antireflective coating comprises a thin film material, said thin film material being one of an oxide, a sulfide, a fluoride, a nitride, a selenide, or a metal.

16. The array of claim 13 further comprising a mechanical support bonded to said back side of said thin active layer substrate, wherein the mechanical support comprises n+ silicon substrate.

* * * * *